(12) United States Patent
Xie et al.

(10) Patent No.: US 11,171,044 B1
(45) Date of Patent: Nov. 9, 2021

(54) PLANARIZATION CONTROLLABILITY FOR INTERCONNECT STRUCTURES

(71) Applicant: INTERNATIONAL BUSINESS MACHINES CORPORATION, Armonk, NY (US)

(72) Inventors: Ruilong Xie, Niskayuna, NY (US); Chanro Park, Clifton Park, NY (US); Kangguo Cheng, Albany, NY (US); Julien Frougier, Albany, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/870,324

(22) Filed: May 8, 2020

(51) Int. Cl.
  *H01L 21/768* (2006.01)
  *H01L 23/522* (2006.01)

(52) U.S. Cl.
  CPC .... *H01L 21/7684* (2013.01); *H01L 21/76802* (2013.01); *H01L 23/5226* (2013.01)

(58) Field of Classification Search
  CPC ............. H01L 21/7684; H01L 23/5226; H01L 21/76802
  See application file for complete search history.

(56) References Cited

U.S. PATENT DOCUMENTS

| 8,357,609 | B2 | 1/2013 | Ryan |
| 9,960,117 | B2 | 5/2018 | Gate et al. |
| 10,037,981 | B2 | 7/2018 | Banna et al. |
| 10,090,303 | B2 | 10/2018 | Cheng |
| 10,177,028 | B1* | 1/2019 | LiCausi ............ H01L 21/76834 |
| 10,177,031 | B2 | 1/2019 | Bao et al. |
| 10,181,421 | B1* | 1/2019 | Ryan ..................... H01L 23/528 |
| 2012/0098133 | A1 | 4/2012 | Yang et al. |
| 2013/0193579 | A1 | 8/2013 | Ponoth et al. |
| 2015/0091181 | A1 | 4/2015 | Li et al. |
| 2017/0301624 | A1* | 10/2017 | Briggs ............. H01L 23/53238 |
| 2018/0151511 | A1 | 5/2018 | Lin et al. |
| 2019/0103367 | A1 | 4/2019 | Chen et al. |
| 2019/0189508 | A1 | 6/2019 | Peethala et al. |

FOREIGN PATENT DOCUMENTS

| CN | 1695093 A | 11/2005 |
| CN | 105917446 A | 8/2016 |
| KR | 100755664 B1 | 9/2007 |
| KR | 1020160002393 A | 1/2016 |

* cited by examiner

*Primary Examiner* — Karen Kusumakar
(74) *Attorney, Agent, or Firm* — Tutunjian & Bitetto, P.C.; L. Jeffrey Kelly (57) ABSTRACT

A method for fabricating a semiconductor device includes selectively etching one or more of a plurality of conductive layers within a metallization level to obtain one or more recessed conductive layers each corresponding to a conductive line lacking a via disposed thereon and at least one conductive line having a via disposed thereon. The metallization level is disposed on a base structure including one or more underlying devices. The method further includes forming a pair of planarization stop layers on each of the one or more recessed conductive layers to a height of the via, and forming a plurality of interlevel dielectric (ILD) layers having a uniform height across the metallization level using the one or more pairs of planarization stop layers.

20 Claims, 10 Drawing Sheets

PLANARIZATION CONTROLLABILITY FOR INTERCONNECT STRUCTURES

BACKGROUND

The present invention generally relates to semiconductor devices, and more particularly to interconnect structures.

Generally, semiconductor devices can include a plurality of circuits which form an integrated circuit fabricated on a substrate. A complex network of signal paths can be routed to connect the circuit elements distributed on the surface of the substrate. Efficient routing of these signals can include the formation of multilevel or multilayered interconnect schemes (e.g., single or dual damascene wiring structures) during the back-end-of-line (BEOL) phase of manufacturing. In addition to signal paths, power can be distributed by interconnect structures from the top-most metallization levels in the BEOL stack down to the device level. Within an interconnect structure, conductive vias can run perpendicular to the substrate and conductive lines can run parallel to the substrate.

SUMMARY

In accordance with an embodiment of the present invention, a method for fabricating a semiconductor device is provided. The method includes selectively etching one or more of a plurality of conductive layers within a metallization level to obtain one or more recessed conductive layers each corresponding to a conductive line lacking a via disposed thereon and at least one conductive line having a via disposed thereon. The metallization level is disposed on a base structure including one or more underlying devices. The method further includes forming a pair of planarization stop layers on each of the one or more recessed conductive layers to a height of the via, and forming a plurality of interlevel dielectric (ILD) layers having a uniform height across the metallization level using the one or more pairs of planarization stop layers.

In accordance with another embodiment of the present invention, a method for fabricating a semiconductor device is provided. The method includes forming a plurality of liners disposed on sidewalls of a plurality of conductive layers within a metallization level disposed on a base structure including one or more underlying devices, and a plurality of first sacrificial layers adjacent to the plurality of liners. The method further includes selectively etching one or more of the plurality of conductive layers to obtain one or more recessed conductive layers each corresponding to a conductive line lacking a via disposed thereon and at least one conductive line having a via disposed thereon, forming a pair of planarization stop layers on each of the one or more recessed conductive layers to a height of the via, forming a second sacrificial layer on each of the one or more recessed conductive layers to a height below the one or more pairs of planarization stop layers, removing the plurality of liners and first sacrificial layers after forming the second sacrificial layer, forming a plurality of first interlevel dielectric (ILD) layer portions including first dielectric material on the base structure after removing the plurality of liners and first sacrificial layers, forming second dielectric material after removing the one or more second sacrificial layers, and planarizing the second dielectric material using the one or more planarization stop layers to form one or more second ILD layer portions to the height of the via. The first and second ILD layer portions collectively form a plurality of ILD layers having a uniform height.

In accordance with yet another embodiment of the present invention, a semiconductor device is provided. The device includes a base structure including one or more underlying devices and a metallization level disposed on the base structure. The metallization level includes at least one conductive layer corresponding to a conductive line having a via disposed thereon, one or more recessed conductive layers each corresponding to a conductive line lacking a via disposed thereon, a pair of planarization stop layers on each of the one or more recessed conductive layers disposed to a height of the via, and a plurality of interlevel dielectric (ILD) layers having a uniform height across the metallization level.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The embodiments described herein provide for the formation of a semiconductor device including a metallization level of an interconnect structure by planarizing dielectric material using planarization stop layers or spacers to form interlevel dielectric (ILD) layers of the metallization level. For example, the planarization can include chemical-mechanical planarization (CMP). More specifically, the metallization level can include a plurality of conductive lines disposed on a base structure. In some embodiments, at least one of the plurality of conductive lines can have a via disposed thereon, and at least one pair of planarization stop layers can be formed on at least one conductive line without a via disposed thereon to about the height of the via. For example, the via disposed on the at least one conductive line can be a self-aligned top via. Accordingly, since the planarization stop layers function to simulate via height across the metallization level, the planarization stop layer(s) can enable planarization uniformity to ensure ILD uniformity across the metallization level.

In some embodiments, the metallization level described herein can include a low via density region. For example, if pitch is defined as a distance between midpoints of consecutive conductive lines, metallization level can include a low via density region if there is at least a three pitch distance between a first conductive line with a via formed thereon and a second conductive line with a via formed thereon (e.g., the metallization level includes, between the first and second conductive lines, at least two consecutive conductive lines without vias disposed thereon). Therefore, the planarization stop layers described herein can address ILD non-uniformity attributed to planarizing dielectric material disposed within a low via density region, such as preventing the formation of, e.g., a rounded or arced ILD layer having a concave surface. However, the embodiments described herein can be applied to metallization levels having any via density that can benefit from improved ILD uniformity.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-X}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
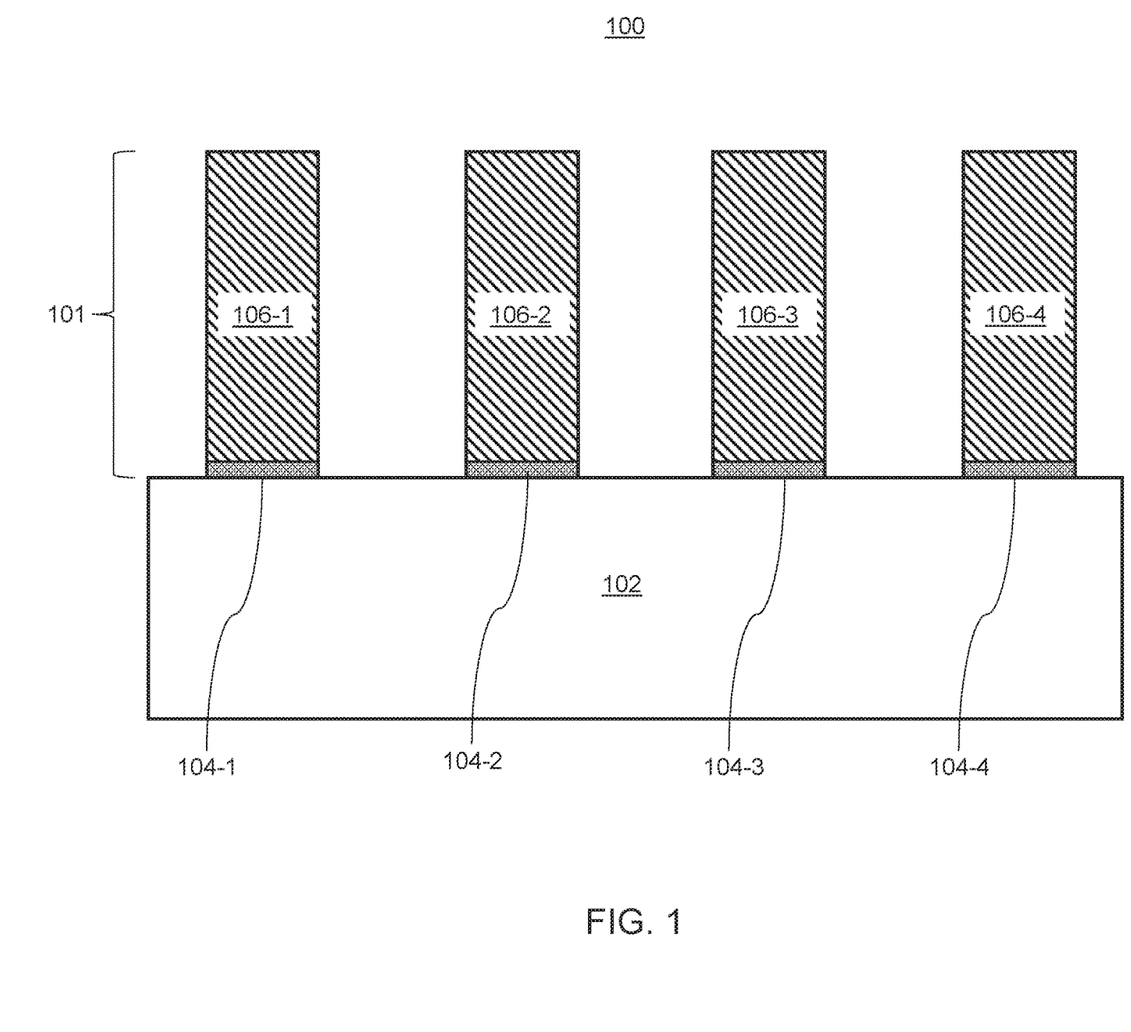
FIG. 1 is a cross-sectional view of the formation of conductive layers during the fabrication of a semiconductor device, in accordance with an embodiment of the present invention.

Referring now to the drawings in which like numerals represent the same or similar elements and initially to FIG. 1, semiconductor device 100 including an interconnect structure is provided. More specifically, the device 100 includes a metallization level 101 disposed on a base structure 102. For example, the base structure 102 can include one or more underlying devices (e.g., one or more transistors with contacts) on which the metallization level 101 is formed on. The base structure 102 can further include one or more underlying conductive material levels. In one embodiment, the interconnect structure can include a top via interconnect structure.

More specifically, FIG. 1 shows the formation of a plurality of conductive layers 106-1 through 106-4 corresponding to the metallization level 101 on the base structure 102. In this illustrative embodiment, the plurality of conductive layers 106-1 through 106-4 are formed on respective ones of a plurality of adhesion layers 104-1 through 104-4 disposed on the base structure 102. However, such an embodiment should not be considered limiting.

The plurality of adhesion layers 104-1 through 104-4 and plurality of conductive layers 106-1 through 106-4 can be formed on the base substrate 102 using any suitable process in accordance with the embodiments described herein. More specifically, the plurality of adhesion layers 104-1 through 104-4 and the plurality of conductive layers 106-1 through 160-4 can be formed using any suitable additive and/or subtractive patterning processes. Additive patterning refers to patterning involving the addition of material to a device (e.g. by deposition), while subtractive patterning refers to patterning involving the removal of material from a device using etching. As pitches become smaller and pitch lines become thinner, subtractive patterning schemes can be attractive due to, e.g., a lack of conductive liner requirement and resistance benefits.

In this illustrative embodiment, the plurality of adhesion layers 104-1 through 104-4 and the plurality of conductive liners 106-1 through 106-4 can be formed using subtractive patterning. For example, forming the plurality of adhesion layers 104-1 through 104-4 and the plurality of conductive layers 106-1 through 106-4 as shown in FIG. 1 can include forming adhesion layer material across the base substrate, forming conductive material across the adhesion layer material, forming a mask over regions of the conductive material corresponding to the plurality of conductive layers 106-1 through 106-4, etching the conductive material and the adhesion layer material based on the mask, and removing the mask after the etching.

The plurality of adhesion layers 104-1 through 104-4 can be thin layers having a thickness of between, e.g., about 1 nm to about 3 nm. The plurality of adhesion layers 104-1 through 104-4 can include any suitable material in accordance with the embodiments described herein. Examples of materials that can be used to form the plurality of adhesion layers 104-1 through 104-4 include, but are not limited to, titanium nitride (TiN), tantalum nitride (TaN), etc.

The plurality of conductive layers 106-1 through 106-4 can include any suitable conductive material in accordance with the embodiments described herein. In one embodiment, the plurality of conductive layers 106-1 through 106-4 can include ruthenium (Ru). However, examples of other suitable conductive materials that can be used to form the plurality of conductive layers 106-1 through 106-4 include, but are not limited to, copper (Cu), tungsten (W), cobalt (Co), aluminum (Al), etc.

The plurality of conductive layers 106-1 through 106-4 can have a critical dimension or width between, e.g., about 10 nm to about 100 nm. More specifically, the critical dimension can be, e.g., about 15 nm. The pitch between adjacent ones of the plurality of conductive layers 106-1 through 106-4, which is a distance defined herein as the critical dimension or width plus the distance between the consecutive ones of the plurality of conductive layers 106-1 through 106-4, can be about double the critical dimension. For example, if the critical dimension is about 15 nm, the pitch is about 30 nm. Accordingly, the distance between consecutive conductive layers can be the same as the critical dimension or width.

Figure 2:
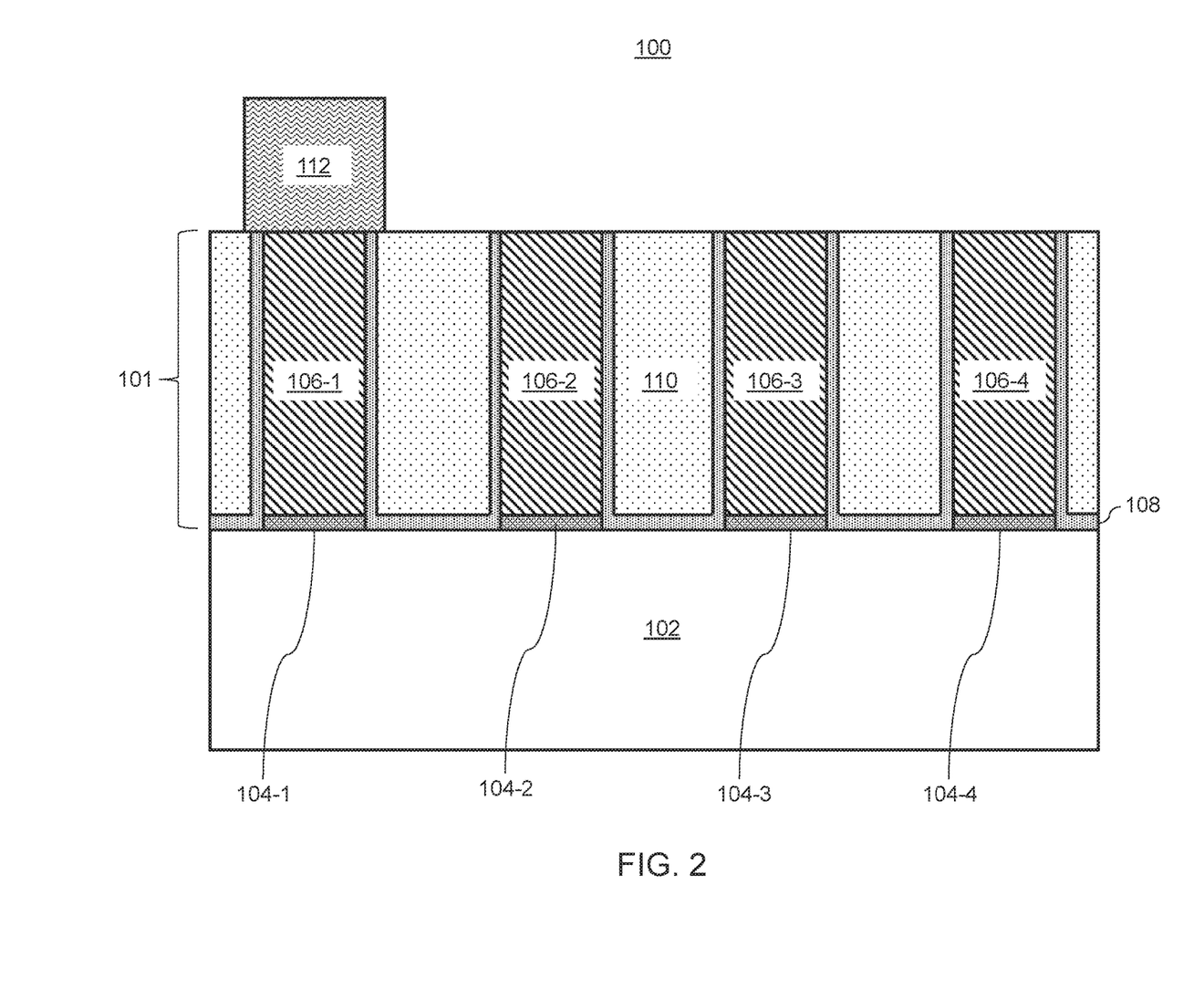
FIG. 2 is a cross-sectional view of the formation of a liner along the conductive layers, a plurality of first sacrificial layers on the liner, and a mask on one of the conductive layers during the fabrication of the semiconductor device, in accordance with an embodiment of the present invention.

With reference to FIG. 2, liners 108 are formed along sidewalls of the plurality of conductive layers 106-1 through 106-4 and along the base structure 102, and sacrificial layers 110 are formed on the liners 108 adjacent to the plurality of conductive layers 106-1 through 106-4.

Forming the liners 108 and the sacrificial layers 110 can include conformally depositing liner material along the sidewalls and upper surfaces of the plurality of conductive layers 106-1 through 106-4, depositing sacrificial layer material on the liner material, and planarizing the sacrificial layer material and the liner material to form the liners 108 and the sacrificial layers 110 (e.g., using chemical-mechanical planarization (CMP)). Any suitable process can be used to form the liner material and the sacrificial layer material on the liner material, and planarize the sacrificial layer material and the liner material to form the liners 108 and the sacrificial layers 110 in accordance with the embodiments described herein.

In one embodiment, the liner material of the liners 108 can be deposited using, e.g., in-situ radical assisted deposition (IRAD). The liners 108 can include any suitable liner material in accordance with the embodiments described herein. For example, the liners 108 can include, e.g., a silicon nitride material (e.g., SiN).

The sacrificial layers 110 can include any suitable sacrificial layer material in accordance with the embodiments described herein. For example, the sacrificial layers 110 can include a suitable dielectric material. In one embodiment, the sacrificial layers 110 can include a spin-on-glass (SOG) material. However, such an embodiment should not be considered limiting.

As further shown in FIG. 2, a mask 112 is formed. In this illustrative embodiment described herein, the metallization level 101 includes a low via density region. For example, as will be described herein below with reference to FIG. 3, the mask 112 is formed to protect the conductive layer 106-1 while other ones of the plurality of conductive layers 106-2 through 106-4 are recessed. In this embodiment, the metallization level 101 is formed to include a low density via region in which the conductive layer 106-1 corresponds to a via (e.g., self-aligned top via) disposed on a conductive lines), while the conductive layers 106-2 through 106-4 are recessed to form conductive lines without any vias formed thereon. However, the embodiments described herein can be applied to metallization levels having any via density that can benefit from improved ILD uniformity. The mask 112 can include any suitable lithography material(s) in accordance with the embodiments described herein.

Figure 3:
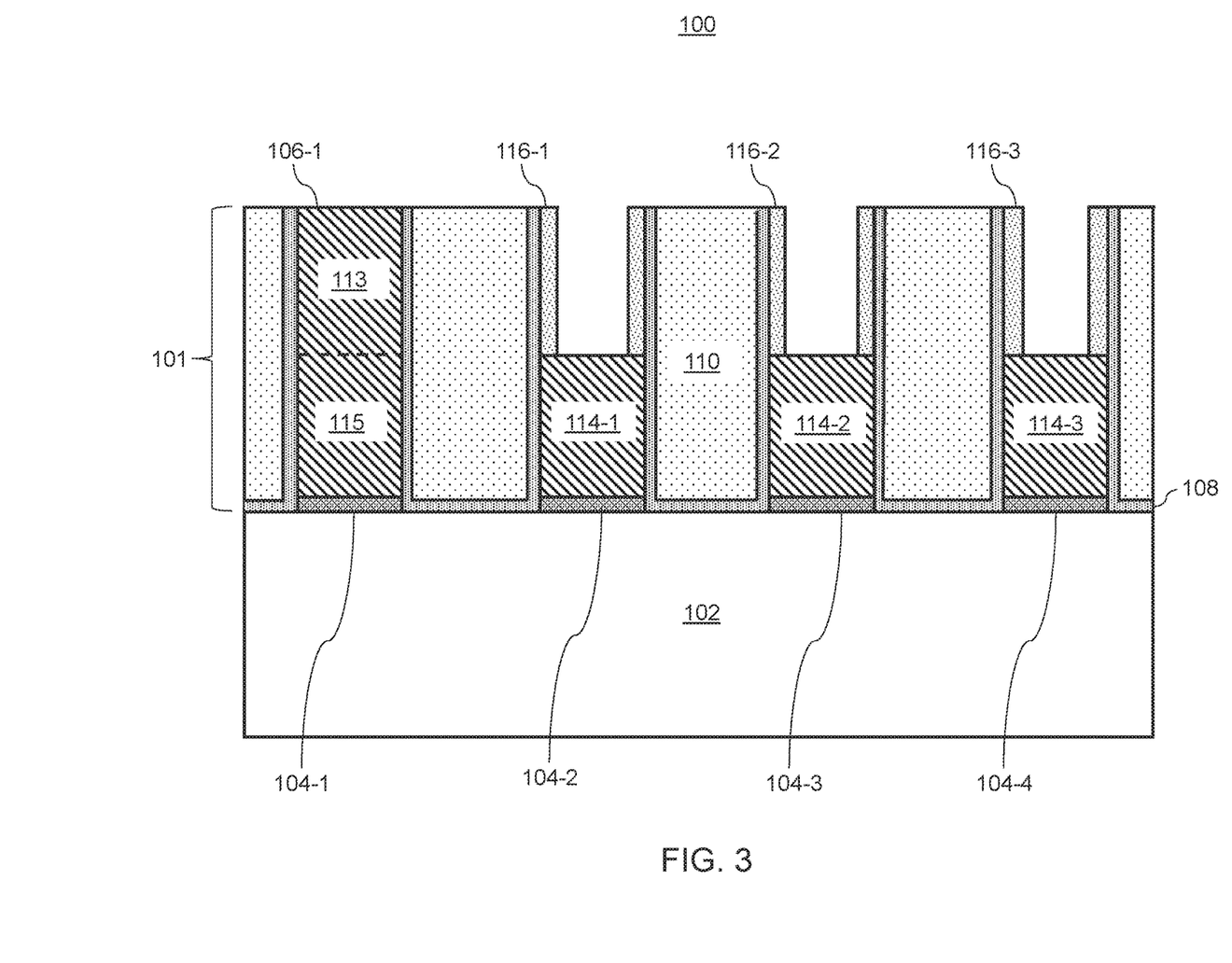
FIG. 3 is a cross-sectional view of selective etching of unblocked ones of the conductive layers to obtain a plurality of recessed conductive layers corresponding to conductive lines, and the formation of a pair of planarization stop layers on each of the plurality of recessed conductive layers during the fabrication of the semiconductor device, in accordance with an embodiment of the present invention.

With reference to FIG. 3, the plurality of conductive layers 106-2 through 106-4 are selectively recessed or etched while the conductive layer 106-1 is protected by the mask 112 to form a plurality of recessed conductive layers 114-1 through 114-3. Any suitable etch process can be used to form the plurality of recessed conductive layers 114-1 through 114-3 in accordance with the embodiments described herein.

The conductive layer 106-1 corresponds to a via 113 disposed on a conductive line 115. For example, the via 113 can be a self-aligned top via. The plurality of recessed conductive layers 114-1 through 114-3 correspond to conductive lines without vias (e.g., self-aligned top vias) disposed thereon.

As further shown in FIG. 3, after the mask 112 is removed, pairs of planarization stop layers 116-1 through 116-3 are formed on respective ones of the plurality of conductive lines 114-1 through 114-3. More specifically, the pairs of planarization stop layers 116-1 through 116-3 are formed along the liners 108 to a height of the conductive layer 106-1, which corresponds to a height of the via 113 on the conductive line 115. The pairs of planarization stop layers 116-1 through 116-3 can be formed from any suitable material in accordance with the embodiments described herein. Examples of suitable materials that can be used to form the pairs of planarization stop layers 116-1 through 116-3 include, but are not limited to, silicon carbide (SiC), silicon oxycarbide (SiOC), etc. Each planarization stop layer of the pairs of planarization stop layers 116-1 through 116-3 can be a thin layer having a thickness of, e.g. about 1 nm to about 6 nm.

Figure 4:
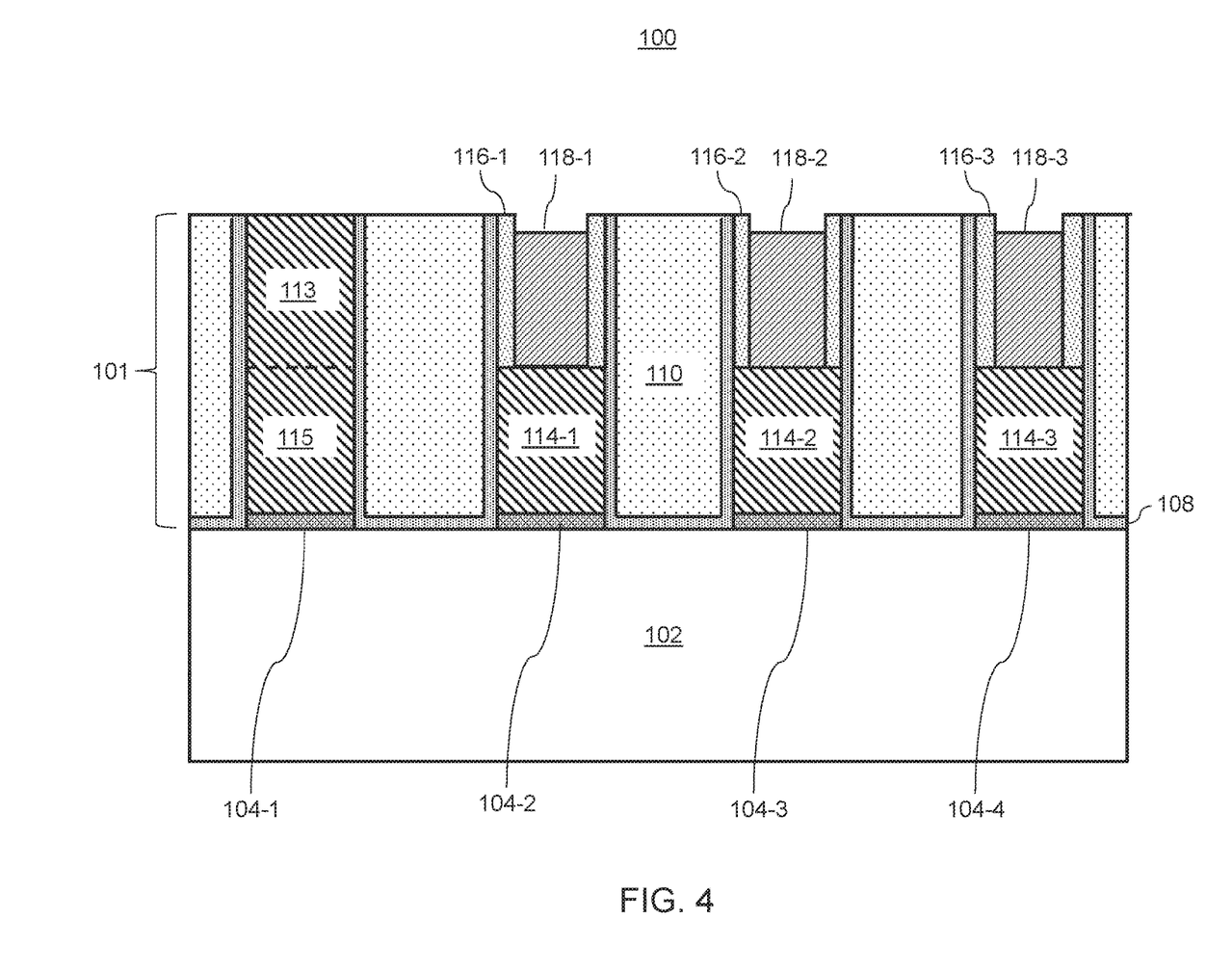
FIG. 4 is a cross-sectional view of the formation of a second sacrificial layer on each of the plurality of recessed conductive layers between the pair of planarization stop layers during the fabrication of the semiconductor device, in accordance with an embodiment of the present invention.

With reference to FIG. 4, a plurality of sacrificial layers 118-1 through 118-3 is formed on respective ones of the plurality of conductive lines 114-1 through 114-3. The plurality of sacrificial layers 118-1 through 118-3 can include any suitable sacrificial material in accordance with the embodiments described herein. In one embodiment, the plurality of sacrificial layers 118-1 through 118-3 can include amorphous silicon (a-Si). However, such an embodiment should not be considered limiting.

Forming the plurality of sacrificial layers 118-1 through 118-3 can include conformally depositing the sacrificial material on exposed surfaces of the device 100, and recessing the sacrificial material to expose the sacrificial layers 110 and form the plurality of sacrificial layers 118-1 through 118-3. As shown, the recessing can result in plurality of sacrificial layers 118-1 through 118-3 having an exposed surface below a height of the via 113.

Figure 5:
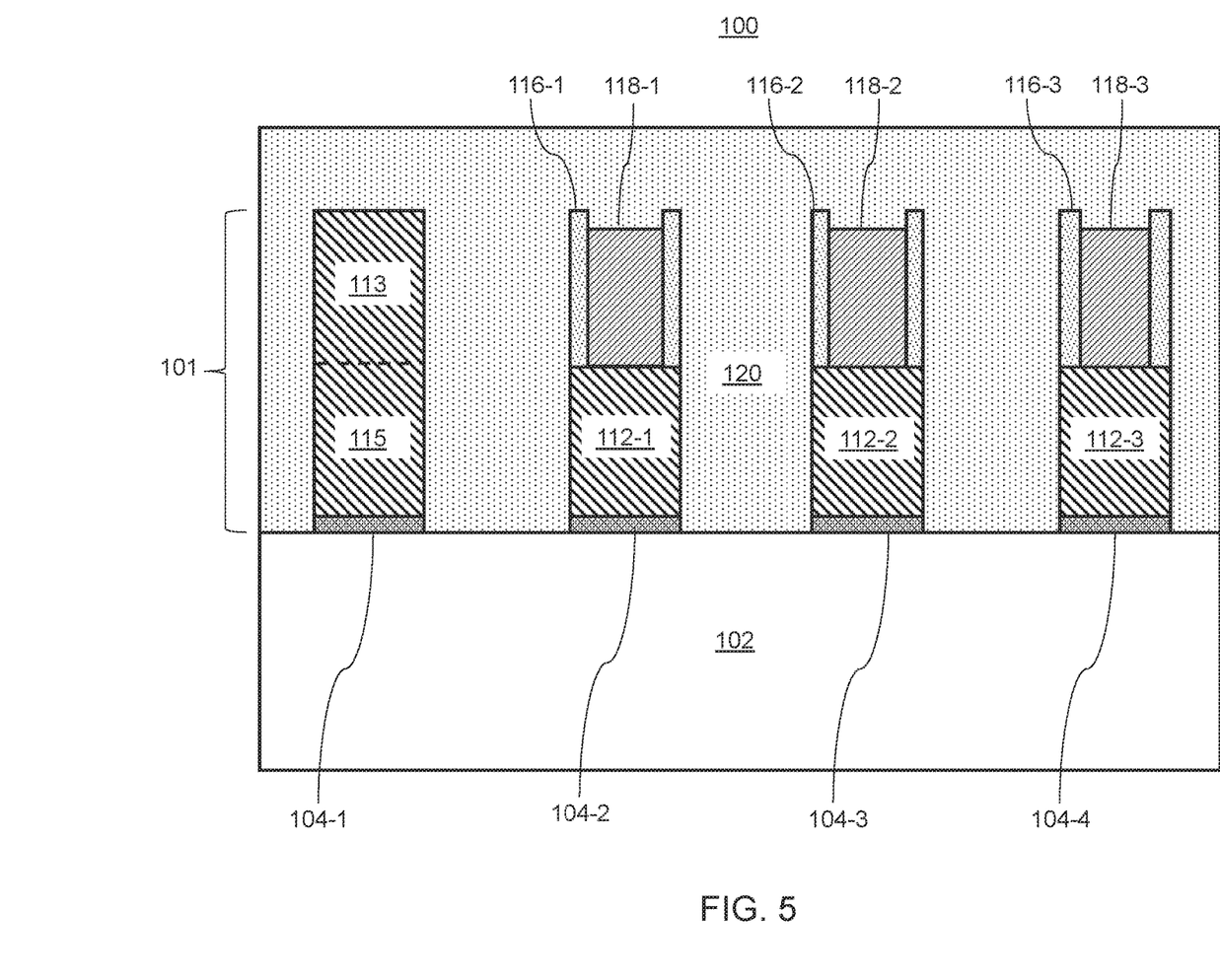
FIG. 5 is a cross-sectional view of the removal of the liner, the plurality of first sacrificial layers, and the formation of first dielectric material during the fabrication of the semiconductor device, in accordance with an embodiment of the present invention.

With reference to FIG. 5, the liners 108 and the sacrificial layers 110 are removed, and dielectric material 120 is formed on the base structure 102 as an overfill to a height above the via 113 and the pairs of planarization stop layers 116-1 through 116-3. Any suitable deposition process can be used to form the dielectric material in accordance with the embodiments described herein.

The dielectric material 120 can include any suitable material in accordance with the embodiments described herein. For example, the dielectric material 120 can include, e.g., a low-k dielectric material. A low-k dielectric material is a material with a dielectric constant k less than the dielectric constant of $SiO_2$ at room temperature (e.g., about 20° C.-25° C.) and atmospheric pressure (e.g., about 1 atm). For example, a low-k dielectric material can have a dielectric constant of less than about 3.9. The dielectric material 120 can have a dielectric constant k between, e.g., about 2.3 and 2.7. In one embodiment, the dielectric material 120 can include an ultra low-k dielectric (ULK) material having a dielectric constant less than or equal to, e.g., about 2.5. Examples of suitable materials that can be used to form the dielectric material 120 include, but are not limited to, octamethylcyclotetrasiloxane (OMCTS), flowable low-k dielectrics (FCVD), spin-on glass dielectrics (SOG), porous silicon carbonitride (SiCN), etc.

Figure 6:
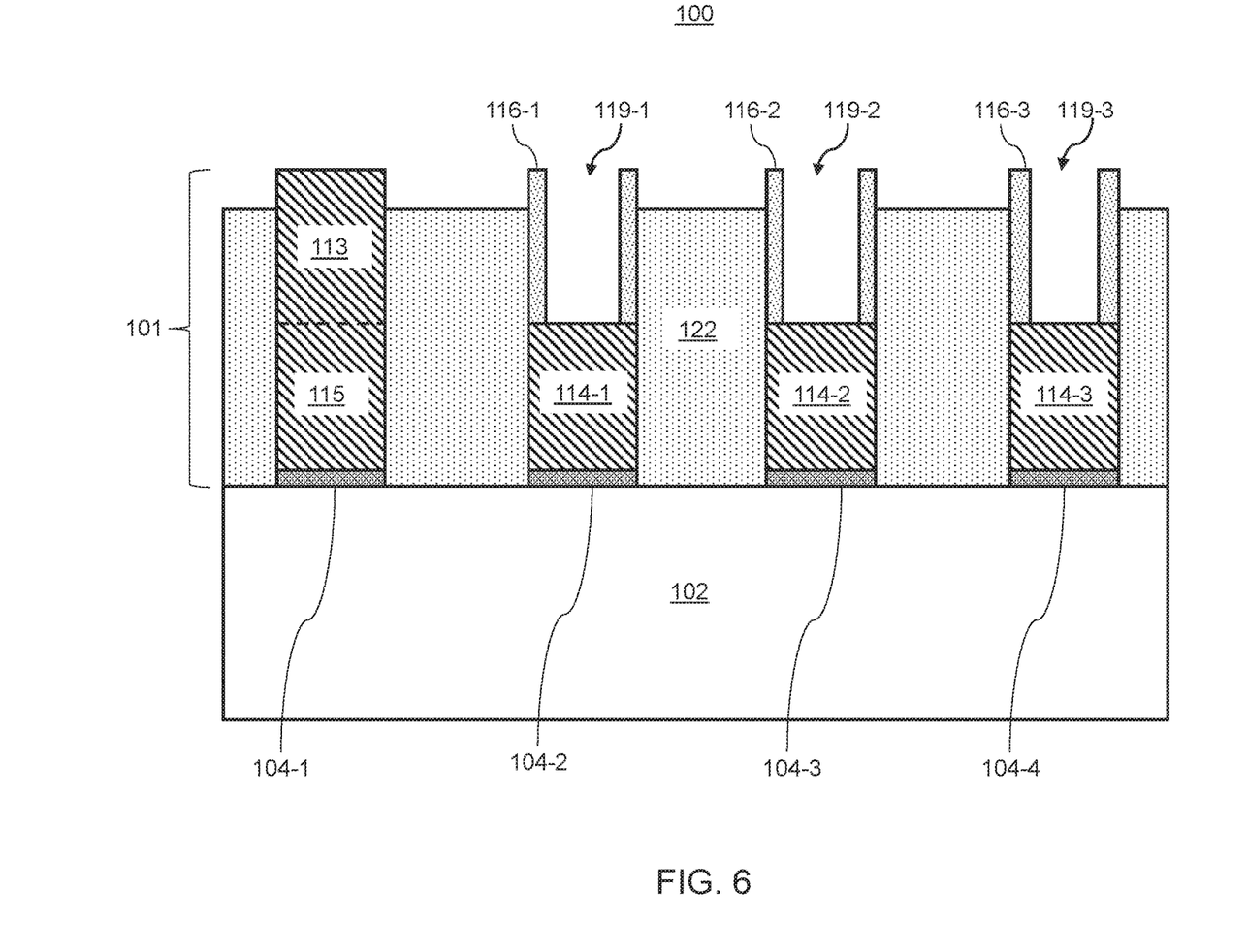
FIG. 6 is a cross-sectional view of the etching back of the first dielectric material to form first interlevel dielectric (ILD) layer portions exposing the second sacrificial layers, and the removal of the second sacrificial layers during the fabrication of the semiconductor device, in accordance with an embodiment of the present invention.

With reference to FIG. 6, the dielectric material 120 is etched back to form first interlevel dielectric (ILD) layer portions 122 revealing the sacrificial layers 118-1 through 118-3, and the sacrificial layers 118-1 through 118-3 are removed to form a plurality of openings 119-1 through 119-3 between respective ones of the pairs of planarization stop layers 116-1 through 116-3.

As shown in this illustrative embodiment, the first ILD layer portions 122 have a height below the heights of the via 113 and the pairs of planarization stop layers 116-1 through 116-3. However, such an embodiment should not be considered limiting. For example, in another embodiment, the first ILD layer portions 122 can be formed to the same height as the via 113 and the pairs of planarization stop layers 116-1 through 116-3.

Figure 7:
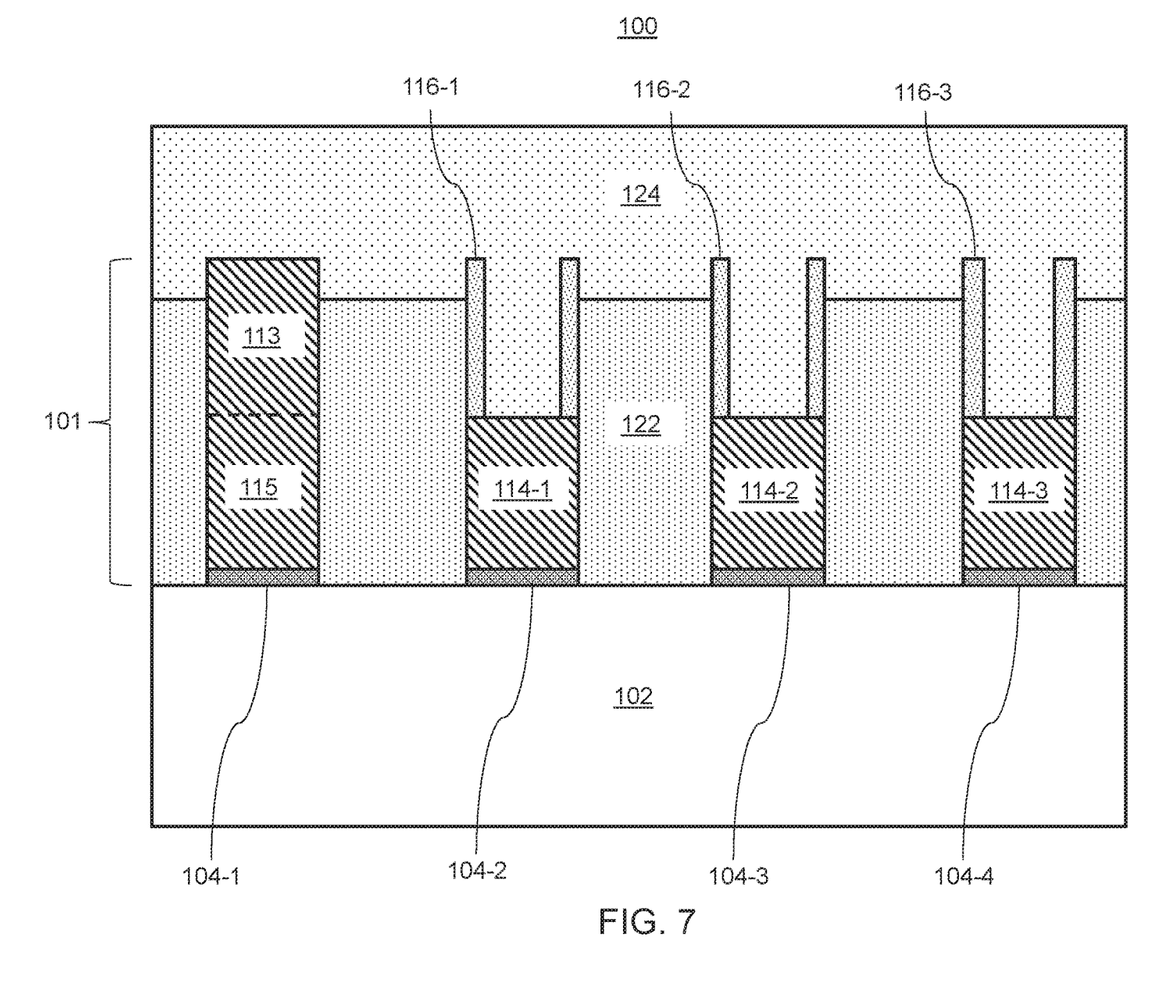
FIG. 7 a cross-sectional view of the formation of second dielectric material during the fabrication of the semiconductor device in accordance with an embodiment of the present invention.

With reference to FIG. 7, dielectric material 124 is formed to fill the plurality of openings 119-1 through 119-3. More specifically, as shown, the dielectric material 124 is formed as an overfill to a height above the via 113 and the pairs of planarization stop layers 116-1 through 116-3. Any suitable deposition process can be used to form the dielectric material 124 in accordance with the embodiments described herein. The dielectric material 124 can include any suitable material in accordance with the embodiments described herein. For example, the dielectric material 124 can include a low-k dielectric material. In one embodiment, the dielectric material 124 can include the same material as the dielectric material of the first ILD layer portions 122. In other embodiments, the dielectric material 124 can include a different dielectric material than the first ILD layer portions 122.

Figure 8:
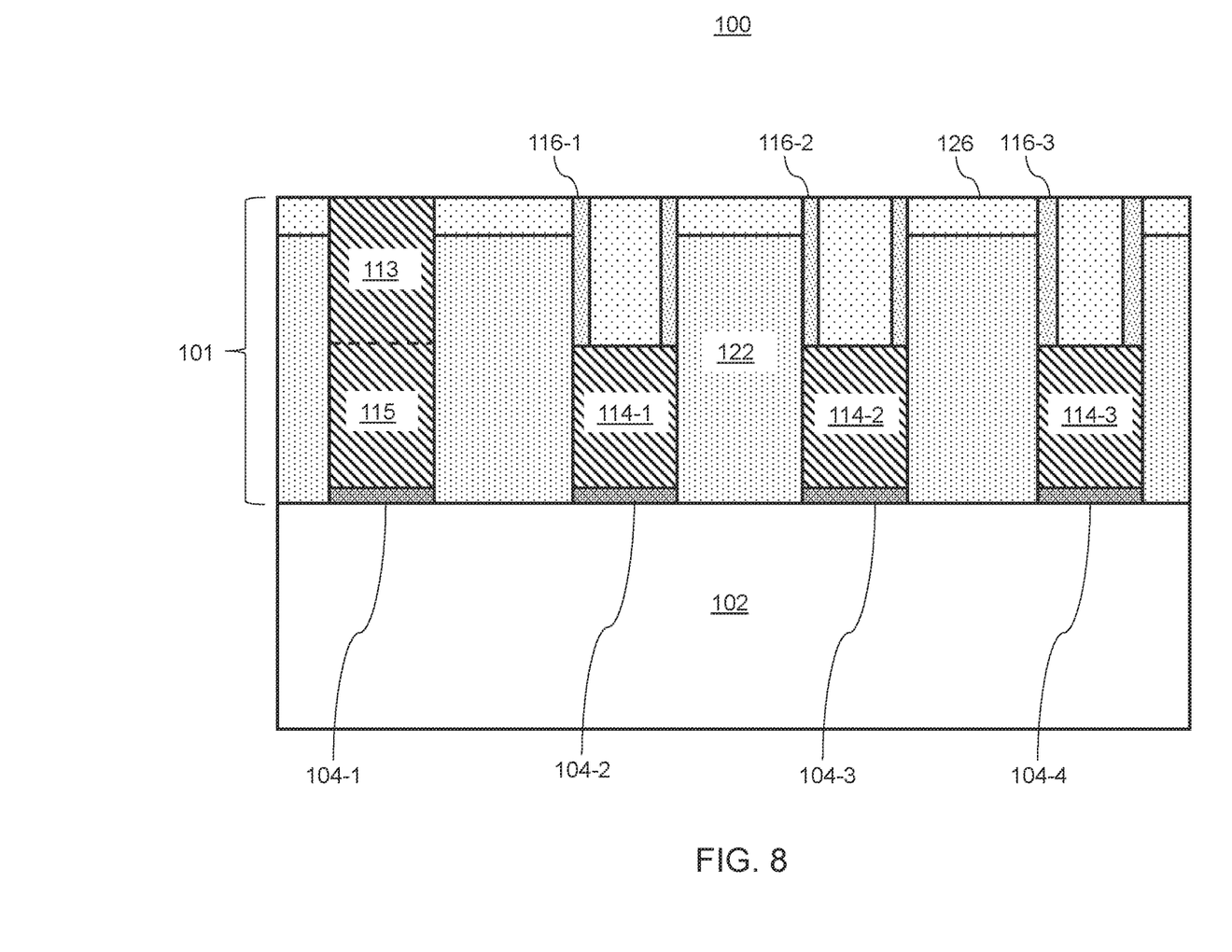
FIG. 8 is a cross-sectional view of planarization of the second dielectric material using the planarization stop layers to form second ILD layer portions on the first ILD layer portions to form ILD layers during the fabrication of the semiconductor device, in accordance with an embodiment of the present invention.

With reference to FIG. 8, the dielectric material 124 is planarized using the pairs of planarization stop layers 116-1 through 116-3 to form second ILD layer portions 126. As shown, the planarization of the dielectric material 124 stops at the pairs of the planarization stop layers 116-1 through 116-3, which enables planarization uniformity across the device 100. More specifically, the second ILD layer portions 126 can be formed to the height of the via 113 and the pairs of the planarization stop layers 116-1 through 116-3. For example, the second ILD layer portions 126 can be formed to be within, e.g., +/−10% of the height of the via 113, or other acceptable tolerance that may be needed. Any suitable planarization process can be used to planarize the dielectric material 124 to form the second ILD layer portions 126 in accordance with the embodiments described herein. For example, chemical-mechanical planarization (CMP) can be used.

As shown in this illustrative embodiment, the second ILD layer portions 126 are disposed on the first ILD layer portions 122 since the first ILD layer portions 122 were formed to a height below the via 113 and the pairs of planarization stop layers 116-1 through 116-3. However, in an embodiment in which the first ILD layer portions 122 are formed to the same height as the via 113 and the pairs of planarization stop layers 116-1 through 116-3, the second dielectric material 124 can be removed from the surfaces of the first ILD layer portions 122 during the formation of the second ILD layer portions 126. Accordingly, the second ILD layer portions 126 are disposed at least on each of the recessed conductive lines 114-1 through 114-3 between the pairs of planarization stop layers 116-1 through 116-3.

The first and second ILD layers portions 122 and 126 collectively form ILD layers of the metallization level 101. By forming the ILD layers of the metallization level 101 in multiple ILD layer formation steps using the pairs of planarization stop layers 116-1 through 116-3 in the manner described herein above with reference to FIGS. 1-8, the ILD layers of the metallization level 101 can be formed to be substantially uniform across the metallization level 101. Otherwise, due to the height difference between the via 113 and the plurality of conductive lines 114-1 through 114-3, the formation of the ILD layers of the metallization level 101 without the uniformity enabled by planarizing the second ILD layer portions 126 without the pairs of planarization stop layers 116-1 through 116-3 would result in the ILD layers of the metallization level 101 having a non-uniform shape (e.g., a rounded or arced concave shape).

The device 100 shown in FIGS. 1-8 are depicted having a metallization level 101 including a low via density region for illustrative purposes only. However, the embodiments described herein can be implemented to enable ILD planarization uniformity within metallization levels having any suitable via densities.

Figure 9:
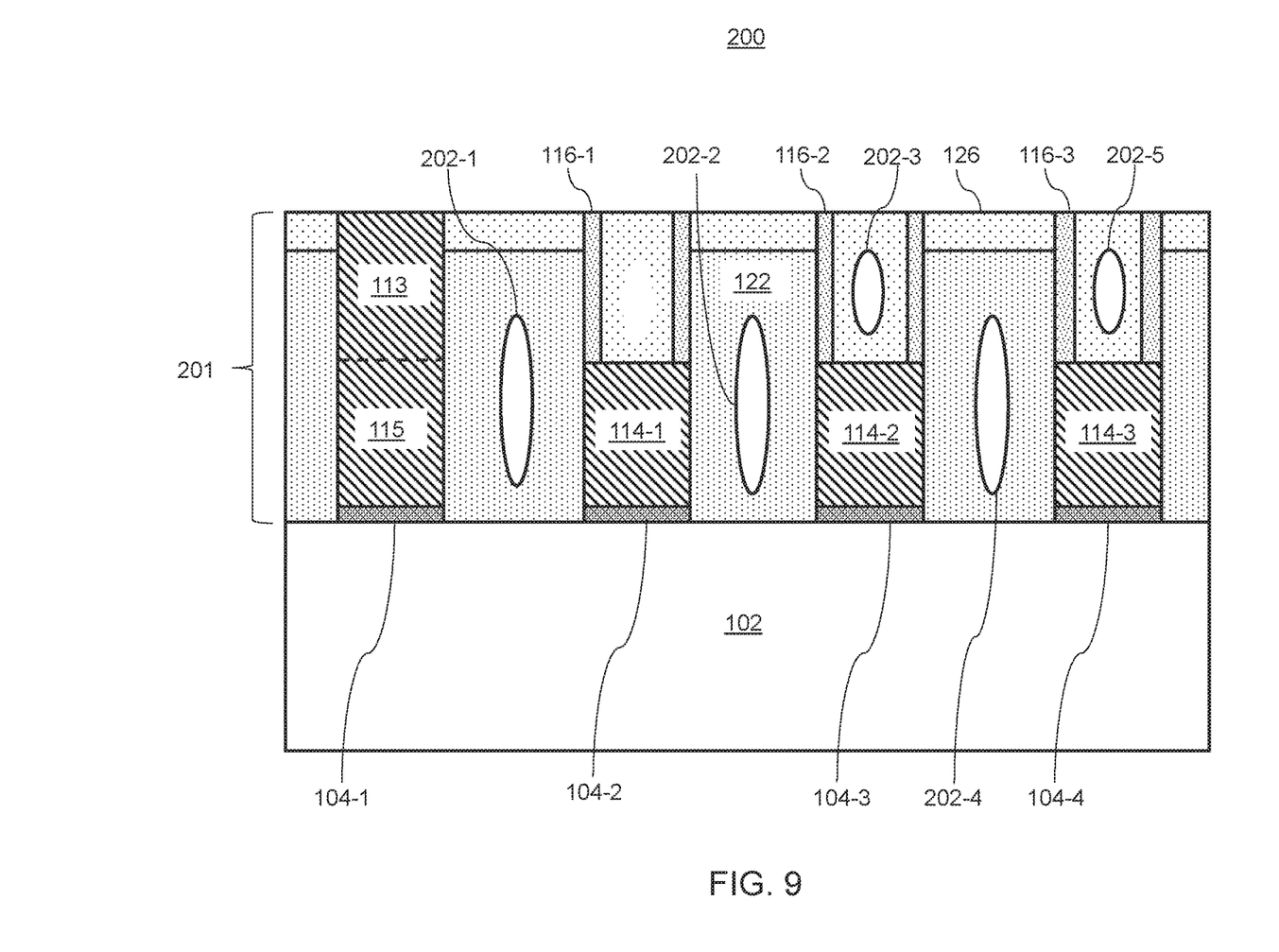
FIG. 9 is a cross-sectional view of a semiconductor device including air gaps with the first and second ILD layers, in accordance with another embodiment of the present invention.

With reference to FIG. 9, a semiconductor device 200 including a metallization level 201 disposed on the base structure 102 is shown. The metallization level 201 is similar to the metallization level 101 described above with reference to FIGS. 1-8, except that the metallization level 201 includes a plurality of air gaps or pockets 202-1 through 202-4 formed within respective portions of the ILD layers of the metallization level 201.

Generally, the plurality of air gaps 202-1 through 202-4 can be formed based on deposition processes during the formation of the plurality of first ILD portions 122 and the plurality of second ILD portions 126. Examples of suitable deposition processes that can be used to form the plurality of first and second ILD layers portions 122 and 126 include, but are not limited to, physical vapor deposition (PVD), chemical vapor deposition (CVD), atomic layer deposition (ALD), and variants and/or combinations thereof. More specifically, the plurality of air gaps 202-1 through 202-4 can be formed as a result of dielectric material pinch-off. Any suitable techniques can be used to form the plurality of air gaps 202-1 through 202-4 in accordance with the embodiments described herein.

The plurality of air gaps 202-1 through 202-4 can provide additional device benefits at least due to vacuum or air having a lower dielectric constant than even the low-k dielectric material that could be employed for the plurality of ILD layers in which the plurality of air gaps 202-1 through 202-4 are formed. For example, the plurality of air gaps 202-1 through 202-4 may provide additional insulation. As another example, the plurality of air gaps 202-1 through 202-4 may decrease parasitic capacitance.

As shown in FIG. 9, as a result of how the plurality of ILD layers of the metallization level 201 were formed using the pairs of planarization stop layers 116-1 through 116-3, the plurality of air gaps 202-1 through 202-4 are formed having a height above a height of the plurality of conductive lines 114-1 through 114-3. However, without using the pairs of planarization stop layers 116-1 through 116-3 to form the plurality of ILD layers of the metallization level 201, air gap formation would occur entirely below the height of the plurality of conductive lines 114-1 through 114-3.

As further shown in FIG. 9, the plurality of air gaps 202-1 through 202-4 are formed having an oval shape. However, such an embodiment should not be considered limiting, and the plurality of air gaps 202-1 through 202-4 can be formed to have any suitable shape in accordance with the embodiments described herein.

Figure 10:
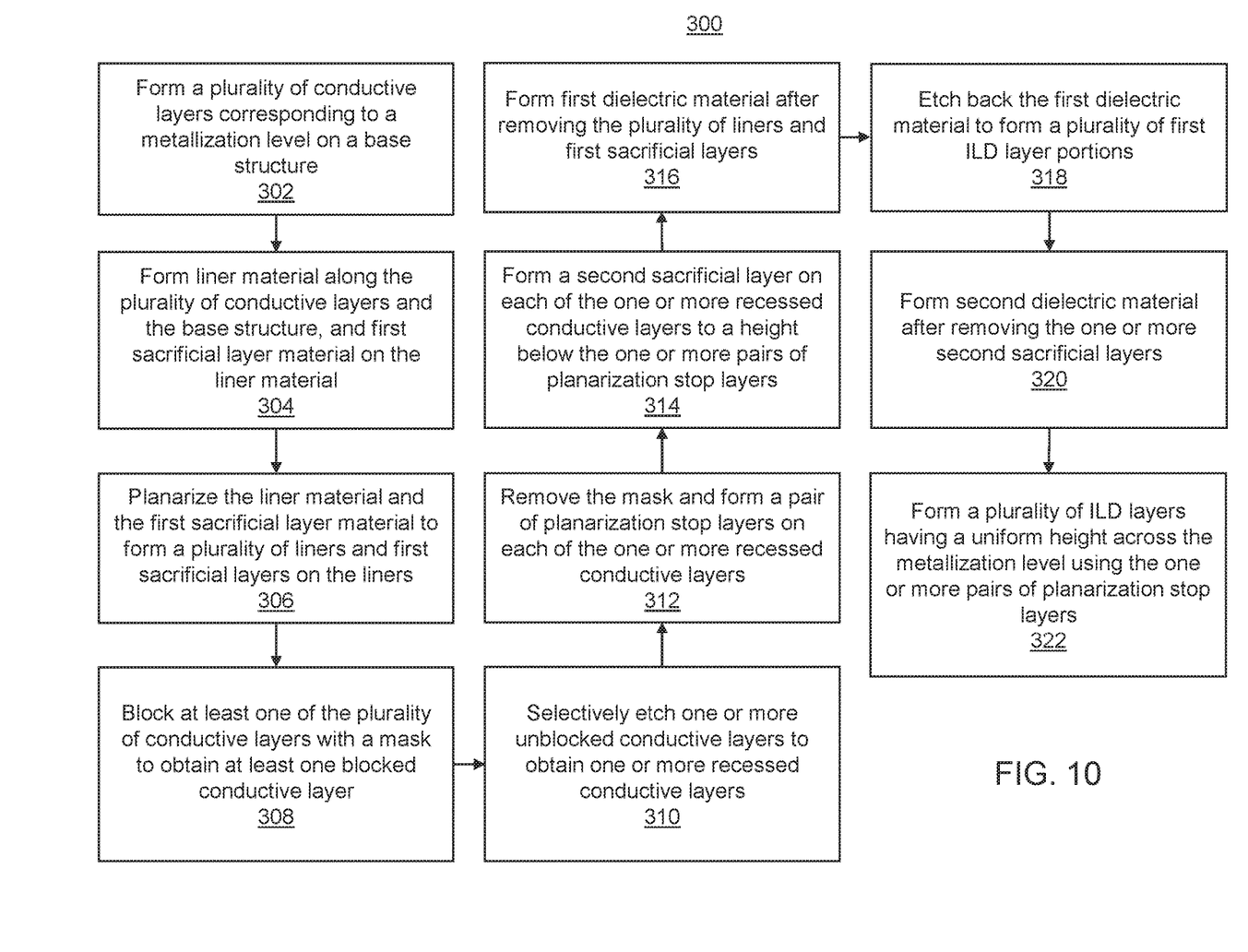
FIG. 10 is a block/flow diagram of a system/method for forming a semiconductor device including a self-aligned top via, in accordance with an embodiment of the present invention.

With reference to FIG. 10, a block/flow diagram is provided illustrating a system/method 300 for fabricating a semiconductor device.

At block 302, a plurality of conductive layers corresponding to a metallization level is formed on a base structure. The metallization level is included within an interconnect structure (e.g., a top via interconnect structure) of the device. For example, the base structure can include one or more underlying devices (e.g., one or more transistors with contacts) on which the metallization level is formed on. The base structure can further include one or more underlying conductive material levels.

The plurality of conductive layers can be formed on the base substrate using any suitable process in accordance with the embodiments described herein. In one embodiment, the plurality of conductive liners can be formed using subtractive patterning. For example, forming the plurality of conductive layers can include forming conductive material across the base structure, forming a mask over regions of the conductive material corresponding to the plurality of conductive layers, etching the conductive material based on the mask, and removing the mask after the etching.

The plurality of conductive layers can include any suitable conductive material in accordance with the embodiments described herein. In one embodiment, the plurality of conductive layers can include ruthenium (Ru). However, examples of other suitable conductive materials that can be used to form the plurality of conductive layers include, but are not limited to, copper (Cu), tungsten (W), cobalt (Co), aluminum (Al), etc.

The plurality of conductive layers can have a critical dimension or width between, e.g., about 10 nm to about 15 nm. More specifically, the critical dimension can be, e.g., about 12 nm. The pitch between adjacent ones of the plurality of conductive layers can be about double the critical dimension. For example, if the critical dimension is about 12 nm, the pitch can be about 24 nm. Accordingly, the distance between adjacent conductive layers can be the same as the critical dimension.

In one embodiment, the plurality of conductive layers are formed on respective ones of a plurality of adhesion layers disposed on the base structure. In this embodiment, adhesion layer material can be formed across the base substrate prior to forming the conductive material. Examples of materials that can be used to form the adhesion layer include, but are not limited to, titanium nitride (TiN), tantalum nitride (TaN), etc.

Further details regarding block 302 are described above with reference to FIG. 1.

At block 304, liner material is formed along the plurality of conductive layers, and first sacrificial layer material is formed on the liner material. Any suitable process can be used to conformally deposit the liner material and the sacrificial layer material on the liner material in accordance with the embodiments described herein. Forming the liner and first sacrificial layer materials can include conformally depositing the liner material along the sidewalls and upper surfaces of the plurality of conductive layers, and depositing the first sacrificial layer material on the liner material. In one embodiment, the liner material can be deposited using, e.g., in-situ radical assisted deposition (IRAD).

The liner material include any suitable material in accordance with the embodiments described herein. For example, the liner material can include, e.g., a silicon nitride material (e.g., SiN).

The first sacrificial layer material can include any suitable layer material in accordance with the embodiments described herein. For example, the first sacrificial layer material can include a suitable dielectric material. In one embodiment, the first sacrificial layer material can include a spin-on-glass (SOG) material. However, such an embodiment should not be considered limiting.

At block 306, the liner material and the first sacrificial layer material are planarized to form a plurality of liners and first sacrificial layers on the liners. More specifically, the plurality of liners are formed along sidewalls of the plurality of conductive layers and along the base structure, the plurality of first sacrificial layers are formed adjacent to the plurality of conductive layers. The planarization at block 306 exposes upper surfaces of the plurality of conductive layers. Any suitable process can be used to planarize the liner material and the first sacrificial layer material in accordance with the embodiments described herein (e.g., CMP).

At block 308, at least one of the plurality of conductive layers is blocked with a mask to obtain at least one blocked conductive layer. More specifically, the at least one blocked conductive layer can correspond to a via disposed on a conductive line. For example, the via can be a self-aligned top via. The at least one mask can include any suitable lithography material(s) in accordance with the embodiments described herein.

Further details regarding blocks 304-308 are described above with reference to FIG. 2.

At block 310, one or more unblocked conductive lines are selectively etched to obtain one or more recessed conductive layers. The mask protects the at least one blocked conductive layer during the selective etching. The one or more recessed conductive layers correspond to one or more conductive lines without vias (e.g., top vias) formed thereon. Any suitable etch process can be used to perform the selective etching in accordance with the embodiments described herein.

At block 312, the mask is removed and a pair of planarization stop layers are formed on each of the one or more recessed conductive layers. More specifically, the one or more pairs of planarization stop layers are formed to a height of the via on the conductive line. The one or more pairs of planarization stop layers can be formed from any suitable material in accordance with the embodiments described herein. Examples of suitable materials that can be used to form the one or more pairs of planarization stop layers include, but are not limited to, silicon carbide (SiC), silicon oxycarbide (SiOC), etc. Each planarization stop layer of the one or more pairs of planarization stop layers can be a thin layer having a thickness of, e.g., about 1 nm to about 6 nm.

Further details regarding blocks 310 and 312 are described above with reference to FIG. 3.

At block 314, a second sacrificial layer is formed on each of the one or more recessed conductive layers to a height below the one or more pairs of planarization stop layers. Forming the one or more sacrificial layers can include conformally depositing second sacrificial material along exposed surfaces of the device, and recessing the second sacrificial material to expose the plurality of first sacrificial layers and form the one or more second sacrificial layers. The one or more second sacrificial layers can include any suitable material in accordance with the embodiments described herein. For example, the one or more second sacrificial layers can include, e.g., amorphous silicon (a-Si). The recessing can result in the one or more second sacrificial layers having an exposed surface below a height of the via.

Further details regarding block 314 are described above with reference to FIG. 4.

At block 316, first dielectric material is formed after removing the plurality of liners and first sacrificial layers. More specifically, the first dielectric material can be formed as an overfill to a height above the via and the one or more pairs of planarization stop layers. Any suitable deposition process can be used to form the first dielectric material in accordance with the embodiments described herein. The first dielectric material can include any suitable material in accordance with the embodiments described herein. For example, the first dielectric material can include, e.g., a low-k dielectric material. In one embodiment, at least one air gap can be formed within the first sacrificial dielectric material having a height above the one or more recessed conductive lines. Any suitable processes can be used to remove the liner and the plurality of first sacrificial layers in accordance with the embodiments described herein.

Further details regarding block 316 are described above with reference to FIGS. 5 and 9.

At block 318, the first dielectric material is etched back to form a plurality of first interlevel dielectric (ILD) layer portions. The etch back exposes the one or more second sacrificial layers. Any suitable processes can be used to etch back the first dielectric material to form the first ILD layer portions in accordance with the embodiments described herein.

In one embodiment, the plurality of first ILD layer portions can be formed to have a height below the heights of the via and the one or more pairs of planarization stop layers. However, such an embodiment should not be considered limiting. For example, in another embodiment, the plurality of first ILD layer portions can be formed to the same height as the via and the one or more pairs of planarization stop layers.

At block 320, second dielectric material is formed after removing the one or more second sacrificial layers. More specifically, the second dielectric material can be formed as an overfill to a height above the via and the one or more pairs of planarization stop layers. The second dielectric material can be formed using any suitable process in accordance with the embodiments described herein. In one embodiment, at least one air gap can be formed within the second dielectric material having a height above the one or more recessed conductive lines.

The second dielectric material can include any suitable material in accordance with the embodiments described herein. For example, the second dielectric material can include, e.g., a low-k dielectric material. In one embodiment, the second dielectric material can include a same material as the first dielectric material. In other embodiments, the second dielectric material can include a different material than the first dielectric material.

Further details regarding blocks 318 and 320 are described above with reference to FIGS. 6, 7 and 9.

At block 322, a plurality of ILD layers having a uniform height across the metallization level is formed using the one or more pairs of planarization stop layers. More specifically, the second dielectric material is planarized using the one or more pairs of planarization stop layers to form one or more second ILD portions disposed on respective ones of the one or more recessed conductive lines to the height of the via, and the first and second ILD layer portions collectively form the plurality of ILD layers. In the embodiment in which the plurality of first ILD layer portions is formed below the height of the via, the one or more second ILD portions include a plurality of second ILD portions disposed on respective ones of the one or more recessed conductive lines and the plurality of first ILD layer portions to the height of the via. Any suitable process can be used to planarize the second dielectric material to form the plurality of ILD layers in accordance with the embodiments described herein. For example, chemical-mechanical planarization (CMP) can be used. Accordingly, the one or more pairs of planarization stop layers ensure the uniformity of the height of the plurality of ILD layers across the metallization level by stopping the planarization process at an appropriate point corresponding to the via height.

Further details regarding block 322 are described above with reference to FIG. 8.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
    selectively etching one or more of a plurality of conductive layers within a metallization level to obtain one or more recessed conductive layers each corresponding to a conductive line lacking a via disposed thereon and at least one conductive line having a via disposed thereon, the metallization level being disposed on a base structure including one or more underlying devices;
    forming a pair of planarization stop layers on each of the one or more recessed conductive layers to a height of the via; and
    forming a plurality of interlevel dielectric (ILD) layers having a uniform height across the metallization level using the one or more pairs of planarization stop layers.

2. The method of claim 1, further comprising blocking at least a first conductive layer of the plurality of conductive layers with a mask, wherein the mask protects the first conductive layer during the selective etching to obtain the at least one conductive line having the via disposed thereon.

3. The method of claim 1, further comprising:
    forming the plurality of conductive layers on the base structure;
    forming liner material along the plurality of conductive layers and the base structure;
    forming first sacrificial layer material on the liner material; and
    planarizing the liner material and the first sacrificial layer material to form a plurality of liners disposed on sidewalls of the plurality of conductive layers and a plurality of first sacrificial layers adjacent to the plurality of liners.

4. The method of claim 3, further comprising forming an adhesion layer between each of the plurality of conductive layers and the base structure.

5. The method of claim 3, wherein the plurality of first sacrificial layers includes spin-on-glass.

6. The method of claim 3, wherein forming the plurality of ILD layers having the uniform height across the metallization level using the one or more pairs of planarization stop layers further includes:
    forming a second sacrificial layer on each of the one or more recessed conductive layers to a height below the one or more pairs of planarization stop layers;
    removing the plurality of liners and first sacrificial layers after forming the second sacrificial layer;
    forming a plurality of first ILD layer portions including first dielectric material on the base structure after removing the plurality of liners and first sacrificial layers;
    forming second dielectric material after removing the one or more second sacrificial layers; and
    planarizing the second dielectric material using the one or more planarization stop layers to form one or more second ILD layer portions to the height of the via, the first and second ILD layer portions collectively forming the plurality of ILD layers having the uniform height.

7. The method of claim 6, wherein the one or more second ILD layer portions include a plurality of second ILD portions disposed on respective ones of the one or more recessed conductive lines and the plurality of first ILD layer portions to the height of the via.

8. The method of claim 6, wherein the second sacrificial layer includes amorphous silicon (a-Si).

9. The method of claim 1, wherein the plurality of ILD layers includes at least one air gap having a height above a height of the one or more recessed conductive layers.

10. A method for fabricating a semiconductor device, comprising:
    forming a plurality of liners disposed on sidewalls of a plurality of conductive layers within a metallization level disposed on a base structure including one or more underlying devices, and a plurality of first sacrificial layers adjacent to the plurality of liners;
    selectively etching one or more of the plurality of conductive layers to obtain one or more recessed conductive layers each corresponding to a conductive line lacking a via disposed thereon and at least one conductive line having a via disposed thereon;

forming a pair of planarization stop layers on each of the one or more recessed conductive layers to a height of the via;

forming a second sacrificial layer on each of the one or more recessed conductive layers to a height below the one or more pairs of planarization stop layers;

removing the plurality of liners and first sacrificial layers after forming the second sacrificial layer;

forming a plurality of first interlevel dielectric (ILD) layer portions including first dielectric material on the base structure after removing the plurality of liners and first sacrificial layers;

forming second dielectric material after removing the one or more second sacrificial layers; and planarizing the second dielectric material using the one or more planarization stop layers to form one or more second ILD layer portions to the height of the via, the first and second ILD layer portions collectively forming a plurality of ILD layers having a uniform height.

11. The method of claim 10, further comprising blocking at least a first conductive layer of the plurality of conductive layers with a mask, wherein the mask protects the first conductive layer during the selective etching to obtain the at least one conductive line having the via disposed thereon.

12. The method of claim 10, further comprising forming the plurality of conductive layers on a base structure, wherein forming the plurality of liners and the plurality of first sacrificial layers further includes:

forming liner material along the plurality of conductive layers and the base structure;

forming first sacrificial layer material on the liner material; and planarizing the liner material and the first sacrificial layer material to form a plurality of liners disposed on sidewalls of the plurality of conductive layers and a plurality of first sacrificial layers adjacent to the plurality of liners.

13. The method of claim 12, further comprising forming an adhesion layer between each of the plurality of conductive layers and the base structure.

14. The method of claim 10, wherein the plurality of first sacrificial layers includes spin-on-glass.

15. The method of claim 10, wherein the one or more second ILD layer portions include a plurality of second ILD portions disposed on respective ones of the one or more recessed conductive lines and the plurality of first ILD layer portions to the height of the via.

16. The method of claim 10, wherein the second sacrificial layer includes amorphous silicon (a-Si).

17. The method of claim 10, wherein the plurality of ILD layers includes at least one air gap having a height above a height of the one or more recessed conductive layers.

18. A semiconductor device, comprising:
a base structure including one or more underlying devices; and
a metallization level disposed on the base structure, the metallization level including:
at least one conductive layer corresponding to a conductive line having a via disposed thereon;
one or more recessed conductive layers each corresponding to a conductive line lacking a via disposed thereon;
a pair of planarization stop layers on each of the one or more recessed conductive layers disposed to a height of the via; and
a plurality of interlevel dielectric (ILD) layers having a uniform height across the metallization level.

19. The device of claim 18, wherein the plurality of ILD layers each include:
a first ILD portion disposed on the base structure; and
a second ILD layer portion disposed at least on each of the one or more recessed conductive lines between the pair of planarization stop layers.

20. The device of claim 18, wherein the plurality of ILD layers includes at least one air gap having a height above a height of the one or more recessed conductive layers.

* * * * *